(12) United States Patent
Gecnuk

(10) Patent No.: US 8,896,325 B2
(45) Date of Patent: Nov. 25, 2014

(54) CAPACITANCE SENSING CIRCUIT AND METHOD OF CAPACITANCE SENSING

(75) Inventor: Libor Gecnuk, Prostejov (CZ)

(73) Assignee: Freescale Semiconductor, Inc., Austin, TX (US)

( * ) Notice: Subject to any disclaimer, the term of this patent is extended or adjusted under 35 U.S.C. 154(b) by 487 days.

(21) Appl. No.: 13/142,425

(22) PCT Filed: Jan. 19, 2009

(86) PCT No.: PCT/IB2009/050173
§ 371 (c)(1),
(2), (4) Date: Jun. 28, 2011

(87) PCT Pub. No.: WO2010/082085
PCT Pub. Date: Jul. 22, 2010

(65) Prior Publication Data
US 2011/0267079 A1    Nov. 3, 2011

(51) Int. Cl.
*G01R 27/26* (2006.01)
*H03K 17/955* (2006.01)
*H03K 17/96* (2006.01)

(52) U.S. Cl.
CPC .. *H03K 17/955* (2013.01); *H03K 2217/960715* (2013.01); *H03K 17/962* (2013.01)
USPC ........ 324/658; 324/657; 324/686; 324/76.66; 324/382; 324/519; 324/548

(58) Field of Classification Search
CPC .. G01R 27/2605; G01R 31/028; G01R 27/26; H03K 17/962; H03K 17/955; H03K 2217/960745
USPC ......... 324/657–658, 637, 661–663, 671–672, 324/678, 686, 688, 76.66, 382, 519, 548
See application file for complete search history.

(56) References Cited

U.S. PATENT DOCUMENTS

| 5,933,102 A | 8/1999 | Miller et al. |
| 2007/0279332 A1* | 12/2007 | Fryer et al. ...................... 345/76 |
| 2008/0036473 A1 | 2/2008 | Jansson |
| 2008/0258740 A1* | 10/2008 | Wright et al. ................. 324/678 |

FOREIGN PATENT DOCUMENTS

GB    2411278 A    8/2005

OTHER PUBLICATIONS

International Search Report and Written Opinion correlating to PCT/IB2009/050173 dated Oct. 5, 2009.

* cited by examiner

*Primary Examiner* — Arleen M Vazquez
*Assistant Examiner* — Son Le

(57) ABSTRACT

A capacitance sensing circuit comprises a capacitive device having a capacitance, the device initially being at a first voltage level. The capacitance sensing circuit is capable of applying one or more pull-up currents to the device during one or more corresponding pull-up periods of time, for changing the first voltage level into one or more corresponding pull-up voltage levels; applying a measurement current to the device; and measuring a measurement period of time, during which one of the pull-up voltage levels changes into a second voltage level. A method of sensing a capacitance of a capacitive device comprises applying a first voltage to the device; applying one or more pull-up currents during corresponding pull-up times, for changing the first voltage into corresponding pull-up voltages; applying a measurement current; and measuring a time, during which one pull-up voltage changes into a second voltage.

13 Claims, 6 Drawing Sheets

CAPACITANCE SENSING CIRCUIT AND METHOD OF CAPACITANCE SENSING

FIELD OF THE INVENTION

This invention in general relates to determination of electrical capacitances and more specifically to a capacitance sensing circuit and a method of capacitance sensing.

BACKGROUND OF THE INVENTION

Electrical capacitance or capacity is the ability of a body to hold an electrical charge. It is also a measure of the amount of electric charge stored by a capacitive device for a given electric potential. For example, a capacitive device may be any type of capacitor. However, any other electrical device may have a capacitance, at least a parasitic capacitance, since whenever an electric voltage exists between two separated conductors, an electric field is present between those conductors. Capacitive sensors utilize the fact that this electric field is sensitive for incidents, such as proximity change of an object, change of a distance between two conductors of the capacitive device (for example due to a pressure change) or change of the electric charge caused for example by a finger touch. For detection and measurement of such an incident, an accurate, reliable and fast measurement of the change in capacitance of the sensor may be required, even for very small capacitance values.

Small capacitances, for example capacitance changes due to a finger touch received at a touch sensor or any other capacitive touch solution, for example being part of a human touch interface, may for example be sensed using a common capacitance sensing circuit as illustrated in the schematic diagram of FIG. 1. The shown circuit comprises a pull-up resistor 12 having a high resistance, for example 1 MΩ, connected to a capacitive device 10 having a capacitance and an additional capacitance caused for example by a finger touch when using the circuit as part of a touch sensor application. Node 16 of the shown circuit is connected to a GPIO (general purpose input/output) pin 18 of a microcontroller (MCU) 20. The resistor 12 may be connected to the same voltage supply $V_{dd}$ as the MCU 20.

Referring also to FIG. 2, a schematic diagram of a variation in time t of voltage U(V) at the capacitive device 10 is shown. The MCU applies a first voltage 68 that may for example correspond to a logical level LOG0 to node 16, followed by a second voltage 70 that may for example correspond to a logical level LOG1, senses a voltage U at the capacitive device 10 and measures a period of time 22, during which the voltage U increases to the second voltage level 70. With the measured time information 22 and resistance value of the resistor 12, the capacitance of the capacitive device 10 can be calculated. However, the measurement period of time 22 for a single sample may be long, for example 40 to 500 microseconds for a typical finger touch sensor, allowing for noise disturbance and instability and requiring considerable consumption of power.

SUMMARY OF THE INVENTION

The present invention provides a capacitance sensing circuit and a method of capacitance sensing as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

Figure 3:
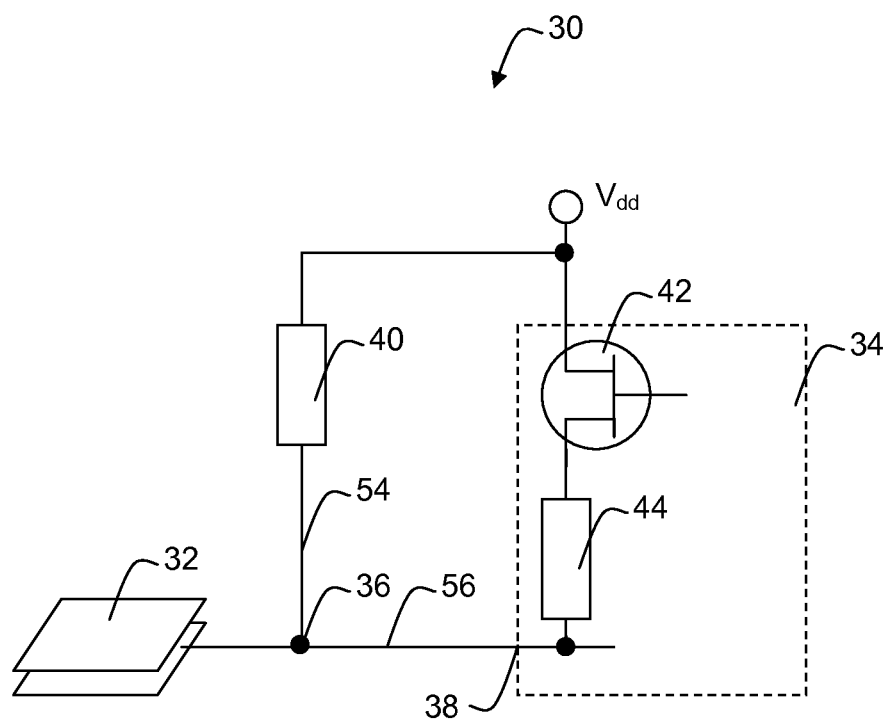
FIG. 3 shows a schematic diagram of an example of an embodiment of a capacitance sensing circuit.

Referring to FIG. 3, a schematic diagram of an example of an embodiment of a capacitance sensing circuit 30 is illustrated. The shown capacitance sensing circuit 30 is connected to a voltage supply $V_{dd}$ and comprises a capacitive device 32 having a capacitance. The capacitive device 32 is initially at a first voltage level 28. The capacitance sensing circuit 30 is then capable of applying one or more pull-up currents to the capacitive device 32 during one or more corresponding pull-up periods of time, for changing the first voltage level into one or more corresponding pull-up voltage levels; applying a measurement current to the capacitive device; and measuring a measurement period of time, during which one of the one or more pull-up voltage levels changes into a second voltage level.

The measurement period of time, i.e. the time for pulling the voltage at the capacitive device 32 from the preceding pull-up voltage level to the second voltage level may then be used for calculating the capacitance of the capacitive device 32. The resulting value may then be a relative capacitance, for example related to a capacitance change due to a finger touch, excluding high capacitances, e.g. parasitic capacitances and the idle capacitance of the device. For a touch sensor this may the capacitance of the sensor when not being touched. However, in order to determine an overall capacity including idle and parasitic capacitances, all periods of time may be measured and evaluated.

Each of the pull-up currents and the measurement current may be currents of different level, strength or intensity.

A corresponding pull-up period of time of a pull-up current may be the period of time, during which the pull-up current is applied to the capacitive device 32. The corresponding pull-up voltage level may be the voltage level at the capacitive device after applying the pull-up current for the corresponding pull-up period of time.

The measurement current may be applied to the capacitive device during the measurement period of time.

After sensing the capacitance of the capacitive device once, the sensing may be repeated once or several times, providing a plurality of samples of measurement periods of time and therefore a plurality of capacitance values. For an even more reliable result, a resulting capacitance value may be calculated from these values, for example as a mean value or as a result of any statistical evaluation.

The capacitance sensing circuit may be capable of determining the one of the one or more pull-up voltage levels, i.e. the pull-up voltage level present at the capacitive device 32 when starting to apply the measurement current to the device, by applying in an initialization phase the one or more pull-up currents to the capacitive device 32 initially being at the first voltage level; measuring an initialization period of time for changing the first voltage level into the second voltage level; and determining the one of the one or more pull-up voltage levels as a voltage level present at the capacitive device 32 after applying the one or more pull-up currents for a fraction of the initialization period of time. This initialization phase may precede a phase of measurement as described before. In case of determining several samples of the capacitance value, typically only the measurement phase may be repeated in a loop.

Applying the pull-up currents during a measurement phase for only a fraction of the initialization period of time may avoid loading the capacitive device 32 to the second voltage level. For example, when determining a length of a period of time by counting cycles of a clock signal, such as a clock signal of a controller 34 applying the different voltage levels to a node 36 of the capacitance sensing circuit 30, a fraction of the initialization period of time may be one clock cycle or ten or a duration of any other amount of clock cycles shorter than the initialization period of time.

The shown controller 34 may control an application of different currents, for example the measurement current and the one or more pull-up currents, to the capacitive device 32. It may also control an application of the first and second voltage levels to node 36 of the capacitance sensing circuit 30. It may also sense a voltage level present at the capacitive device 32 and measure the measurement period of time, for example by counting clock cycles. In the shown embodiment, the controller may use a pin 38 connected to the node 36 for applying the first voltage level corresponding to a first logical level LOG0 and the second voltage level corresponding to a second logical level LOG1.

Figure 1:
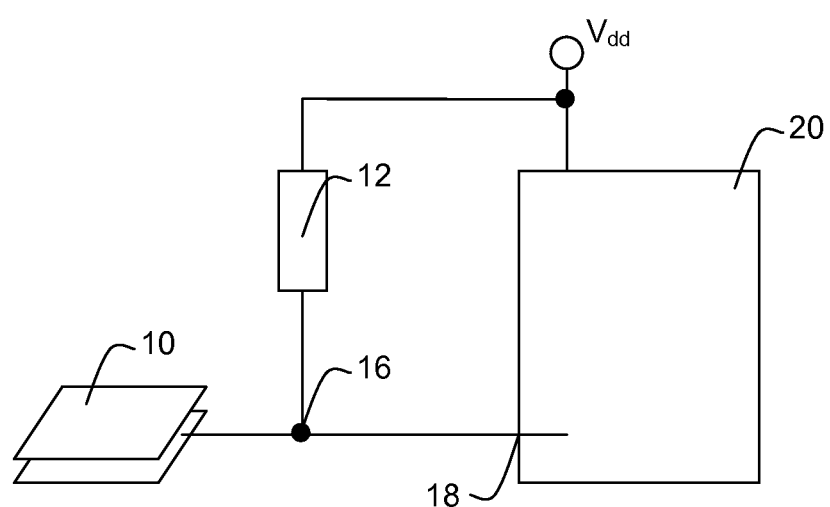
FIG. 1 shows a schematic diagram of an example prior art capacitance sensing circuit.
Figure 2:
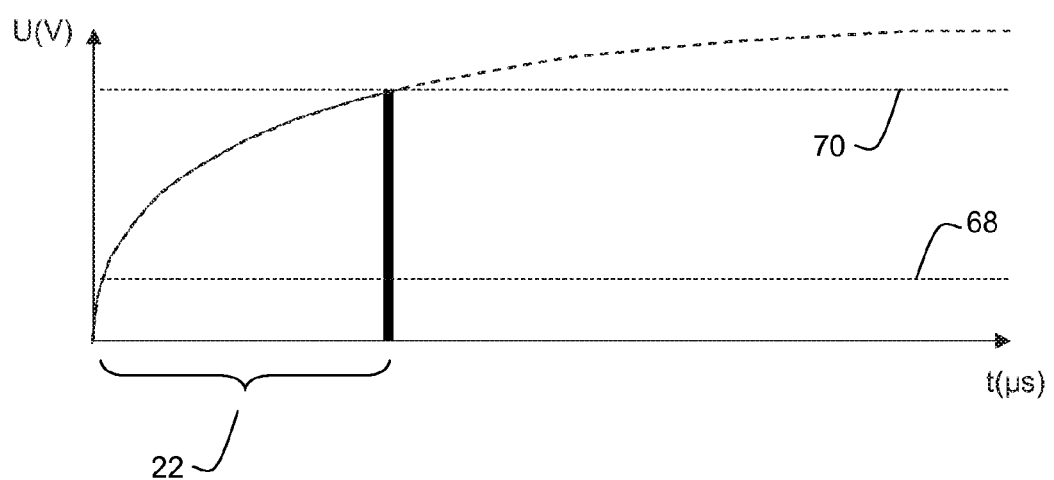
FIG. 2 shows a schematic diagram of an example of a variation in time t of voltage U(V) at the capacitive device shown in FIG. 1.
Figure 4:
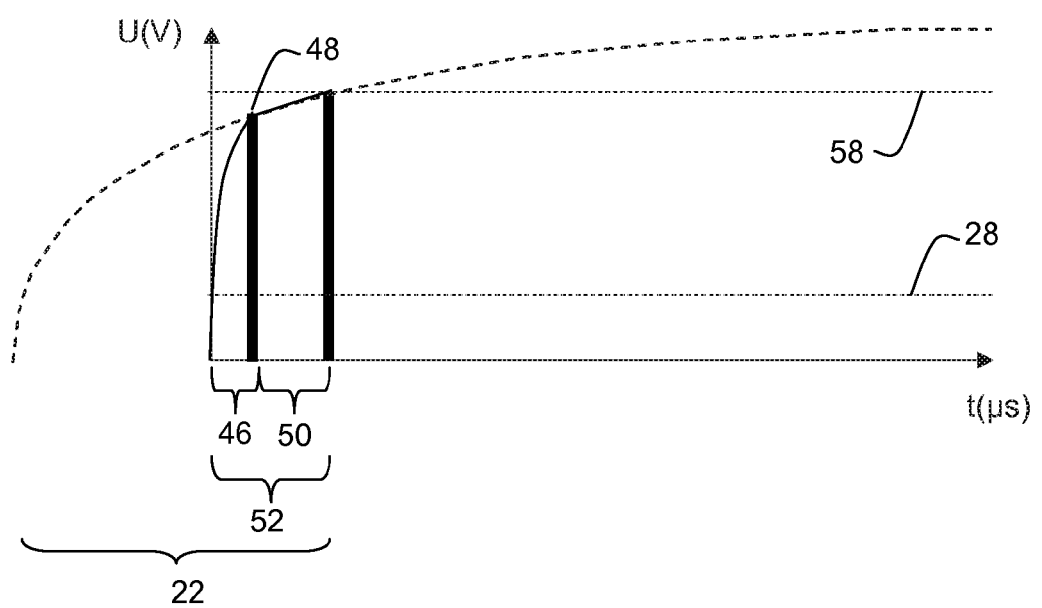
FIG. 4 shows a schematic diagram of an example of a variation in time t of voltage U(V) at the capacitive device shown in FIG. 3.

Referring now also to FIG. 4, a schematic diagram of an example of a variation in time t of voltage U(V) at the capacitive device illustrated in FIG. 3 during a measurement phase is shown. During a pull-up period of time 46 (or turbo time), U(V) may increase from the first voltage level 28 to a pull-up voltage level 48 and further increase during a measurement period of time 50 to the second voltage level 58. The conversion of capacitance change into a period of time that can be accurately measured may be very fast compared to prior art. Therefore, the capacitance sensing circuit 30 may be regarded as a capacitive turbo sensing circuit. The overall required time 52 for sensing the capacitance may be reduced, for example when comparing it to the period of time 22 shown in FIG. 2. A pull-up current with a strength above the strength of the measurement current for preloading the capacitive device 32 may reduce the overall time for capacitance sensing. A strength of the measurement current may be smaller than a strength of at least one of said one or more pull-up currents. This may allow for accurate capacitance measurement after fast pre-loading. The strength of the measurement current may for example be much smaller than the strength of any pull-up current or may even be zero.

The pull-up duration 46 may be short and may for example be much shorter than the measurement time 50. Together, the overall time for a pull-up and measurement for a capacitance may for example be less than 40 microseconds, for example 15 microseconds or down to 0.4 microseconds.

The capacitance sensing circuit 30 may be optimized to achieve highest accuracy of capacitance to time (C/T) conversion and may be a robust and low-cost capacity measurement solution for slight or unknown manufacturing changes of the used hardware, for example changes of parasitic capacitances and resistances, outside or inside the MCU. This may also even more enhance application flexibility and adaptability, especially when measuring small capacity changes.

This high speed measurement of small capacitances due to fast RC transient with suppressed noise and increased stability may also be used for accurate current sensing applications. And the speed of measurement may reduce power consumption of the capacity measurement, since the controller 34 of the circuit may remain in a sleep mode for most of the time. Due to speed-up of C/T conversion, a nearly noiseless measurement signal may be generated, allowing for highly accurate measurement.

Since the overall duration of capacitance sensing may be adjusted by varying periods of time used for applying a pull-up current and the measurement current, a maximal conversion time may be guaranteed, which may be especially relevant when using a capacitance sensing circuit in a real-time application.

The capacitance sensing circuit 30 may comprise a plurality of different current paths for applying the measurement current and each of the one or more pull-up currents to the capacitive device 32 using a different one of the different current paths. A sequence of different currents, for example the one or more pull-up currents and the measurement current may be provided by a plurality of current sources. However, the sequence of different currents may be provided by a current source capable of providing different current levels or by circuitry supplied by one or more current sources, providing different current paths and a controller 34 for switching between the current paths. Switching between different current paths may be easier to implement than switching a current source. When implementing a capacitive sensing circuit 30 on a printed circuit board or as a part of a system-on-a-chip or an integrated circuit, the available current source may not easily be changed by the application. The term "current path" may refer to a single physical conductive connection between a current source and sink. However, it may also refer to a combination of physical currents paths, for example a parallel connection of a plurality of physical connections, each providing a portion of the current provided by the current path.

At least one of the different current paths may comprise a switch 42 for switching off and/or on the at least one of the different current paths. In the example shown in FIG. 3, the capacitive sensing circuit 30 comprises one switch 42, for example a transistor controlled by the controller 34, therefore allowing for two different current paths 54 for the measurement current and (56, 54) for a pull-up current.

The controller 34 may also measure periods of time, for example by counting clock cycles of a clock signal.

In order to provide different currents, each of the plurality of different current paths may comprise a different resistance. The resistance of a current path may be the resistance of one or more resistors 40, 44 comprised in a current path, which may be for example a connecting line or a parallel connection of lines. However, any electrical device and connecting line may have a resistance.

The measurement current may be provided through a measurement current path 54 of the plurality of different current paths (54, (56, 54)), and at least one of the plurality of different current paths may have a smaller resistance than the measurement current path 54. For example, the resistance of the measurement current path 54 may be 10 times or 40 times higher than the resistance of a pull-up current path. In the example shown in FIG. 3, measurement resistor 40 may for example have a resistance of 1 Mega ohm and pull-up resistor 44 may have a resistance of 25 kilo ohm, i.e. current path 54 may have a resistance of 1 Mega ohm and current path (56, 54) may have a resistance close to 25 kilo ohm due to the parallel connection of resistors 40 and 44, allowing for a high pull-up current and a low measurement current.

The capacitance sensing circuit 30 shown in FIG. 3 may be an example of a circuit for accurately sensing very small capacitances. For example, a capacitance may be less than 1 nF, i.e. $10^{-9}$ Farad or $10^{-9}$ Coulombs/Volt, or less than 100 pF, or even less than 100 fF. The circuit 30 may for example also be used to measure capacitances of 10 pF down to 10 fF.

Such small capacitances may be measured when the capacitive device 32 may be a capacitive sensor or a part of it, for example a touch sensor, a proximity sensor, an acceleration sensor, or a pressure sensor for small pressure differences.

As described above, the shown capacitance sensing circuit 30 may comprise a controller 34. The controller 34 may be a processing unit and said first and second voltage level 28, 58 may be provided at a pin 38 of the processing unit. The processing unit 34 may be a microcontroller unit (MCU). However, it may be any type of processing unit or microprocessor, such as a central processing unit (CPU), a graphics processing unit (GPU), any other general purpose processor (GPP), a digital signal processor (DSP) etc. The pin 38 may be an input/output pin of the unit 34, for example a general purpose input/output (GPIO) pin.

As illustrated in FIG. 3 as an example, at least one of the resistances may be a resistance of an internal pull-up resistor 44 of said pin 38 of the processing unit 34. This may for example allow an implementation of the shown circuit at reduced costs and provide protection from external influences, e.g. temperature changes, assuring a high accuracy of measurement.

Figure 5:
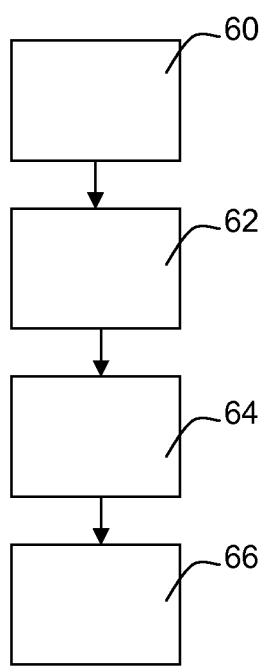
FIG. 5 shows a schematic flow diagram of a first example of an embodiment of a method of capacitance sensing in a capacitance sensing circuit.

Referring now to FIG. 5, a schematic flow diagram of a first example of an embodiment of a method of sensing a capacitance of a capacitive device is illustrated. The illustrated methods allow implementing the advantages and characteristics of the described capacitance sensing circuit as part of a method of sensing a capacitance of a capacitive device. The method comprises applying 60 a first voltage level to the capacitive device; applying 62 one or more pull-up currents to the capacitive device during one or more corresponding pull-up periods of time, for changing the first voltage level into one or more corresponding pull-up voltage levels; applying 64 a measurement current to the capacitive device; and measuring 66 a measurement period of time, during which one of the one or more pull-up voltage levels changes into a second voltage level. These steps may be performed during a measurement phase, which may for example be repeated in a loop for sensing a plurality of capacitance sample values.

The measurement phase may be preceded by an initialization phase. The sensing method may comprise applying in an initialization phase the one or more pull-up currents to the capacitive device initially being at the first voltage level; measuring an initialization period of time for changing the first voltage level into the second voltage level; and determining the one of the one or more pull-up voltage levels as a voltage level present at the capacitive device after applying the one or more pull-up currents for a fraction of the initialization period of time.

Figure 6:
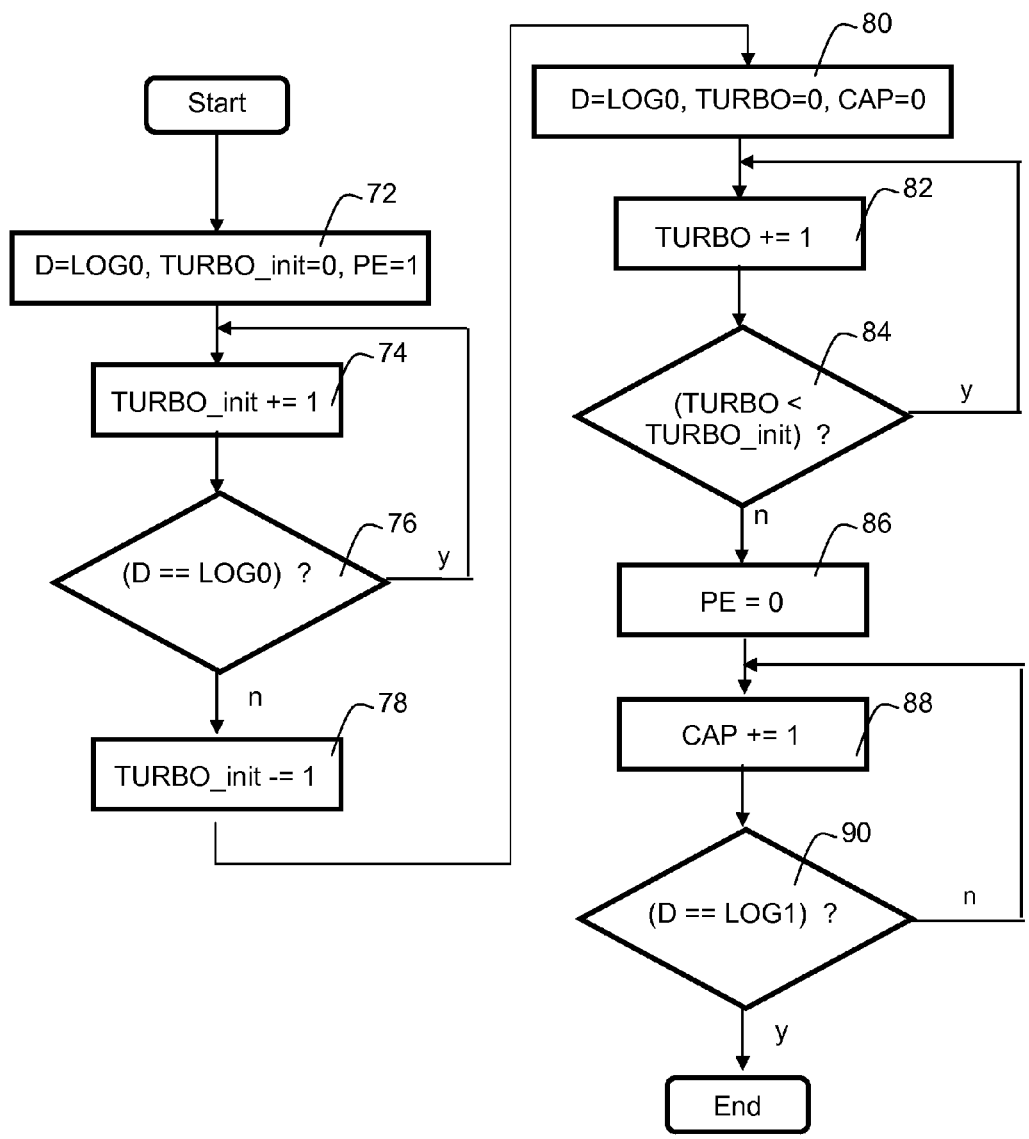
FIG. 6 shows a schematic flow diagram of a second example of an embodiment of a method of capacitance sensing in a capacitance sensing circuit.

Referring now also to FIG. 6, a schematic flow diagram of a second example of an embodiment of a method of capacitance sensing in a capacitance sensing circuit is shown. An initialization phase 72, 74, 76, 78 may comprise setting 72 a logical voltage level D at a capacitive device of a capacitance sensing circuit to first logical voltage level LOG0, enable a pull-up current path by setting a switch PE to 1 and a first clock cycle counter TURBO_init of a clock signal of a controller to 0 and apply second logical voltage level LOG1 to the capacitance sensing circuit. Afterwards increase 74 counter TURBO_init by 1 with each clock cycle as long as D remains LOG0 76. When D changes from LOG0 to LOG1, TURBO_init may represent the time (measured as an amount of clock cycles) for transition of a voltage level at the capacitive device from LOG0 to LOG1. TURBO_init may then be decreased 78, for example by 1, in order not to reach the LOG1 by applying the pull-up current.

In a measurement phase 80, 82, 84, 86, 88, 90 which may be repeated in a loop (not shown) for determining more than one sample capacitance, a step may comprise setting 80 the logical voltage level D at the capacitive device to LOG0 again, initializing a second clock cycle counter TURBO and a third clock cycle counter CAP to 0, and applying LOG1 to the capacitive sensing circuit. TURBO may now be increased 82 and the capacitive device may receive the pull-up current as long as TURBO is still smaller than TURBO_init 84. Otherwise pull-up current precharging of the capacitive device may end, the pull-up current path may be switched off 86 by setting PE to 0. This may allow application of a measurement current through a measurement path. The third clock cycle counter CAP may now be increased 88 with each clock cycle as long as D does not change to the second logical level LOG1 90. After D changing to LOG1, CAP may represent a measurement time of the capacitive device related to the capacitance of the device.

A computer program product may comprise code portions for executing steps of a method or for implementing parts of a capacitance sensing circuit as described above when run on a programmable apparatus.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, at least portions of the architecture may be implemented using a programmable logic device (PLD), e.g. a field programmable gate array (FPGA), an application specific integrated circuit (ASIC) etc., or as a program code executable by a processing device, such as a digital signal processor (DSP), a microcontroller unit (MCU), a general purpose processor (GPP), a central processing unit (CPU), a graphics processing unit (GPU) etc.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of systems. For example, although FIG. 3 and the discussion thereof describe an exemplary capacitance sensing circuit, this exemplary circuit is presented merely to provide a useful reference in discussing various aspects of the invention. Of course, the description of the circuit has been simplified for purposes of discussion, and it is just one of many different types of appropriate circuits that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures or circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of the capacitance sensing circuit are circuitry located on a single integrated circuit or within a same device. Alternatively, the capacitance sensing circuit 30 may include any number of separate integrated circuits or separate devices interconnected with each other.

Also for example, capacitance sensing circuit 30 or portions thereof may be soft or code representations of physical circuitry or of logical representations convertible into physical circuitry. As such, capacitance sensing circuit 30 may be embodied in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A capacitance sensing circuit, comprising
a capacitive device having a capacitance;
said capacitance sensing circuit being capable of
applying in an initialization phase a pull-up current to said capacitive device, said capacitive device initially being at a first voltage level;
measuring an initialization period of time for changing said first voltage level into a second voltage level by means of said pull-up current;
determining a pull-up voltage level as a voltage level present at said capacitive device after a fraction of said initialization period of time;
applying in a measurement phase said pull-up current to said capacitive device, said capacitive device initially being at said first voltage level, during a pull-up period of time, for changing said first voltage level into said pull-up voltage level;
applying a measurement current to said capacitive device, said capacitive device being at said pull-up voltage level; and
measuring a measurement period of time, during which said pull-up voltage level changes into said second voltage level by means of said measurement current.

2. The capacitance sensing circuit as claimed in claim 1, wherein a strength of said measurement current is smaller than a strength of at least one of said one or more pull-up currents.

3. The capacitance sensing circuit as claimed in claim 1, comprising
a plurality of different current paths for applying said measurement current and each of said one or more pull-up currents to said capacitive device using a different one of said different current paths.

4. The capacitance sensing circuit as claimed in claim 3, wherein at least one of said different current paths comprises a switch for switching off and/or on said at least one of said different current paths.

5. The capacitance sensing circuit as claimed in claim 3, wherein each of said plurality of different current paths comprises a different resistance.

6. The capacitance sensing circuit as claimed in claim 5, wherein said measurement current is provided through a measurement current path of said plurality of different current paths, at least one of said plurality of different current paths having a smaller resistance than said measurement current path.

7. The capacitance sensing circuit as claimed in claim 1, wherein said capacitance is less than 10−9 Farad.

8. The capacitance sensing circuit as claimed in claim 1, wherein said one or more pull-up currents and said measurement current are provided by different current sources.

9. The capacitance sensing circuit as claimed in claim 1, wherein said first and said second voltage level are provided at a pin of a processing unit.

10. The capacitance sensing circuit as claimed in claim 9, wherein at least one of said resistances is a resistance of an internal pull-up resistor of said pin of said processing unit.

11. The capacitance sensing circuit as claimed in claim 1, wherein said capacitive device is a capacitive sensor.

12. A method of sensing a capacitance of a capacitive device, comprising
  applying in an initialization phase a pull-up current to a capacitive device, said capacitive device initially being at a first voltage level;
  measuring an initialization period of time for changing said first voltage level into a second voltage level by means of said pull-up current;
  determining a pull-up voltage level as a voltage present at said capacitive device after applying said pull-up current for a fraction of said initialization period of time;
  applying the first voltage level to said capacitive device;
  applying in a measurement phase the pull-up current to said capacitive device, said capacitive device being at said first voltage level, during a pull-up period of time, for changing said first voltage level into said pull-up voltage level;
  applying a measurement current to said capacitive device, said capacitive device being at said pull-up voltage level; and
  measuring a measurement period of time, during which said pull-up voltage level changes into said second voltage level by means of said measurement current.

13. A non-transitory computer program product, comprising code portions for executing steps of a method as claimed in claim 12.

* * * * *